(12) United States Patent
Vranken

(10) Patent No.: US 7,945,828 B2
(45) Date of Patent: May 17, 2011

(54) INTEGRATED CIRCUIT ARRANGEMENT AND DESIGN METHOD

(75) Inventor: Hendrikus Petrus Elisabeth Vranken, Weert (NL)

(73) Assignee: NXP B.V., Eindhoven (NL)

( * ) Notice: Subject to any disclaimer, the term of this patent is extended or adjusted under 35 U.S.C. 154(b) by 271 days.

(21) Appl. No.: 12/093,639

(22) PCT Filed: Oct. 23, 2006

(86) PCT No.: PCT/IB2006/053895
§ 371 (c)(1),
(2), (4) Date: Sep. 22, 2008

(87) PCT Pub. No.: WO2007/054845
PCT Pub. Date: May 18, 2007

(65) Prior Publication Data
US 2009/0024893 A1    Jan. 22, 2009

(30) Foreign Application Priority Data

Nov. 14, 2005   (EP) ..................................... 05110725

(51) Int. Cl.
*G01R 31/28*   (2006.01)
(52) U.S. Cl. ........................................ 714/724; 714/729
(58) Field of Classification Search .................. 714/732, 714/724, 726, 738, 733, 734, 30, 729
See application file for complete search history.

(56) References Cited

U.S. PATENT DOCUMENTS

| 7,243,110 B2 * | 7/2007 | Grondin et al. ............... 707/693 |
| 7,308,634 B2 * | 12/2007 | Kiryu ............................. 714/733 |
| 7,552,373 B2 * | 6/2009 | Wang et al. ................... 714/729 |

OTHER PUBLICATIONS

Krishnendu, Chakrabarty; et al "Zero-Aliasing Space Compaction of Test Responses Using Multiple Parity Signatures" IEEE Transactions on Very Large Scale Integration (VLSI) Systems, vol. 6, No. 2, Jun. 1998, pp. 309-313.
Sinanoglu, O; et al "Parity-Based Output Compaction for Core-Based SOCs" European Test Workshop, 2003. Proceedings. The 8th IEEE. May 25, 2003, pp. 15-20.
Das, Sunil; et al "Fault Tolerance in Systems Design in VLSI Using Data Compression Under Constraints of Failure Probabilities" IEEE Transactions on Instrumentation and Measurement, vol. 50, No. 6, Dec. 2001.

* cited by examiner

*Primary Examiner* — Phung M Chung

(57) ABSTRACT

An integrated circuit (IC) arrangement (10) comprises an integrated circuit (100) having a digital circuit portion (120) with a plurality of digital outputs (122), each of the outputs being arranged to provide a test result in a test mode of the integrated circuit (100). The arrangement (10) further comprises space compaction logic (140) comprising a space compaction network (160) having a plurality of compaction domains (162), each domain being arranged to compact a plurality of test results into a further test result, and a spreading network (150) coupled between the plurality of digital outputs (122, 210) and the space compaction network (160), the spreading network being arranged to duplicate each test result from the digital outputs (122,210) to a number of compaction domains (162). This space compaction logic (140), which may be located on the IC 100 or external thereto such as on a test apparatus or on a test interface, reduces the risk of fault cancellation or fault aliasing compared to SCLs without spreading network.

14 Claims, 2 Drawing Sheets

INTEGRATED CIRCUIT ARRANGEMENT AND DESIGN METHOD

The present invention relates to an integrated circuit (IC) arrangement having space compaction logic for compacting a test result from the digital outputs of the IC in the arrangement.

The present invention further related to a method for designing such space compaction logic.

IC testing is rapidly becoming a dominating factor in the manufacturing costs of ICs. One of the main reasons for this is that for complex ICs testing is time-consuming. This is mainly because large amounts of test input and output data have to be communicated with the IC under test. Consequently, measures to reduce the size of the data involved in this communication have attracted considerable attention.

For instance, test solutions have been disclosed in which digital test input data has been compacted, with the IC having an on-board extractor for restoring the test input data to its original size. Similarly, the digital test outputs of the IC under test have been compacted by an on-board compactor, and the IC test results are provided to the outside world in this compacted form. An example of this approach can be found in: "Parity-based output compaction for core-based SOCs" by Sinanoglu et al., Proc. Of the Eight IEEE European Test Workshop, pages 15-20, IEEE ETW 2003. In such approaches, each compacted test response to a test input, e.g. a test vector provided to the IC under test is analyzed to determine whether the provided test vector triggered the detection of a fault.

A drawback of using compacted test results is that at least some test resolution may be lost, especially when using parity-tree based compactors, which are typically based on exclusive OR (XOR) logic gates. Hence, the occurrence of a fault producing an even number of faulty bits on the outputs of the IC that are fed into the compactor, or the simultaneous occurrence of multiple faults may lead to the faulty bits cancelling each other out. Also, determining the location of the fault may become more difficult because of fault aliasing, which occurs when multiple faults produce the same faulty bits on the outputs of the space compaction logic, which means that the compacted test response is only indicative of the occurrence of a number of faulty bits without the possibility of assigning them to a specific fault.

The present invention seeks to provide an integrated circuit arrangement according to the opening paragraph with improved test resolution.

The present invention further seeks to provide a method for designing space compaction logic for such an arrangement.

According to an aspect of the present invention, there is provided an integrated circuit arrangement comprising an integrated circuit comprising plurality of digital outputs, each of the outputs being arranged to provide a test result in a test mode of the integrated circuit, and space compaction logic comprising a space compaction network having a plurality of compaction domains, each domain being arranged to compact a plurality of test results into a further test result, and a spreading network coupled between the plurality of digital outputs and the space compaction network, the spreading network being arranged to duplicate each test result from the digital outputs to a number of compaction domains.

By the division of a space compaction logic in several domains, which may be separate trees of exclusive logic gates such as XOR gates, with each domain receiving a subset of the digital outputs of the IC through a spreading network, more detailed IC test results can be obtained at the outputs of the space compaction logic. In particular, the risk of fault cancellation and fault aliasing destroying the observability and/or detectability of faults on board the IC is reduced due to the fact that this is likely to occur in some compaction domains only, whereas other compaction domains may only be sensitive to a subset of the faults leading to the cancellation or aliasing, which prevents the occurrence of these unwanted effects in those domains.

For this reason, it is preferable that each compaction domain is coupled to a unique set of digital outputs, because this minimizes the chance of cancellation and/or aliasing effects occurring in all domains.

Preferably, the spreading network is configurably coupled to the digital outputs of the IC to facilitate bypassing the space compaction logic in functional (i.e. operational) mode of the IC.

The space compaction network may be located on the IC, with its outputs being directly observable at least some of the pins of the IC. This has the advantage that the test results are readily available, e.g. after every cycle of the test clock, which facilitates fast processing of the test results.

Alternatively, each compaction domain has an output for producing its further test result, the integrated circuit further comprising a shift register for serially shifting data towards a test data output of the integrated circuit, the respective outputs of the compaction domains being coupled to respective cells of the shift register. This has the advantage that the IC only needs to have a single test data out pin, which helps to reduce the pin count of the IC in case dedicated test pins are necessary.

The space compaction logic may also be located outside the IC, e.g. as part of a test means including an automated test apparatus and a load board for coupling the integrated circuit to the test apparatus, with the space compaction logic located either on the load board or the test apparatus.

According to a further aspect of the invention, there is provided a method for designing space compaction logic for testing an integrated circuit having a plurality of digital outputs, the space compaction logic comprising a space compaction network having a plurality of compaction domains having m outputs, each domain being arranged to compact a plurality of test results into a further test result, and a spreading network having n inputs for coupling between the plurality of digital outputs and the space compaction network, the spreading network being arranged to duplicate each test result from the digital outputs to f compaction domains, f, n and m being positive integers with n being larger than m, and m being larger than f, the method comprising generating a set of bit vectors, each vector comprising m bits, each bit indicating the presence of a conductive path from an input of the spreading network to an output of the space compaction network, the total number of conductive paths per vector being f and combining n vectors from the set of bit vectors into a matrix of size n*m, such that in a direction of the matrix perpendicular to the direction of the vectors the number of said conductive paths is limited, said matrix representing the space compaction logic design.

With this method, an integrated circuit arrangement of the present invention can be designed.

The invention is described in more detail and by way of non-limiting examples with reference to the accompanying drawings, wherein.

It should be understood that the Figures are merely schematic and are not drawn to scale. It should also be understood that the same reference numerals are used throughout the Figures to indicate the same or similar parts.

Figure 1:
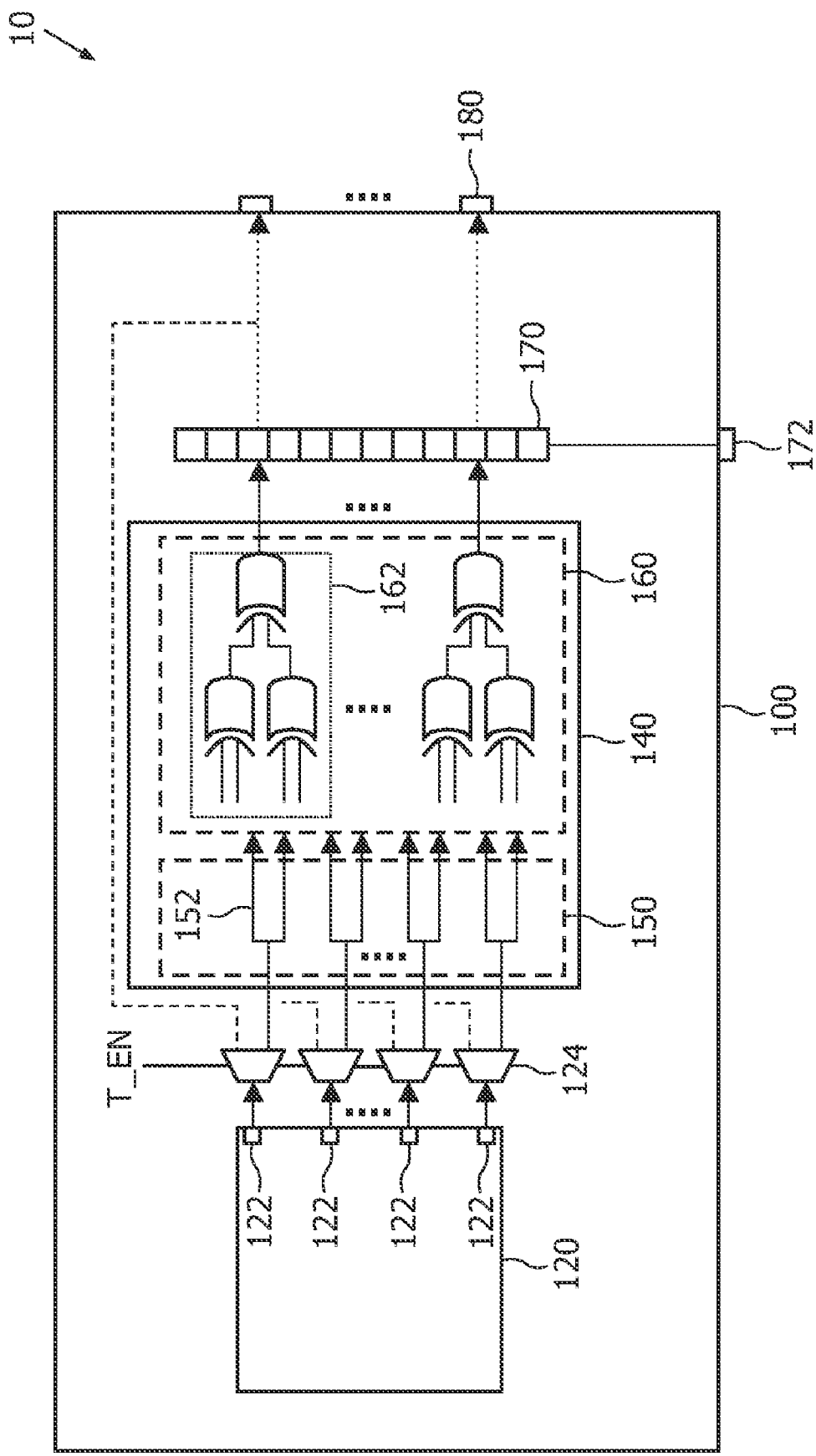
FIG. 1 depicts an IC arrangement of the present invention.

FIG. 1 shows an IC arrangement 10 having an IC 100 with a digital portion 120. The digital portion 120 has digital outputs 122, which are conductively coupled to space compaction logic 140. Digital outputs 122 may be outputs of scan chains for testing the internals of IC 100 in a test mode or other data outputs. The space compaction logic 140 comprises a spreading network 150 and a space compaction network 160 having multiple space compaction domains 162, each of which are implemented as an XOR tree, although other implementations are equally feasible. The spreading network 140 is coupled to the digital outputs 122 via respective demultiplexers 124, which are responsive to a test enable signal T_EN. In absence of this signal, the demultiplexers 124 ensure that the space compaction logic is removed from the conductive signal path from the digital outputs 122, e.g. by forwarding the signals from the digital outputs 122 to the IC pins 180. The demultiplexers 124 are shown by way of non-limiting example only; other types of switches or even other mechanisms to put the IC 100 into a test mode are equally feasible.

The spreading network 150 is arranged to duplicate each digital output a number of times and to provide a corresponding number of compaction domains 162 with such a duplicated output. Preferably, each compaction domain 162 receives a unique set of inputs from the spreading network 150, that is, each compaction domain 162 is coupled to unique subset of digital outputs 122. Because no two compaction domains 162 receive the same set of inputs, the chance that all compaction domains 162 suffer from fault cancellation or aliasing is greatly reduced. The compaction domains 162 may each have the same number of inputs, but this is not strictly necessary.

The ratio between the number of inputs of space compaction network 160 (i.e. the sum of inputs of all compaction domains 162) and the number of digital outputs 122 determines the spreading or multiplication factor of the spreading network 150. For instance, for a IC 120 having 100 digital outputs and a space compaction network 160 having 500 inputs, the factor f of the spreading network 150 is 5. For routing purposes, it is preferred that this factor is kept as low as possible to avoid routing congestion in the design of the IC arrangement. This is especially relevant if the space compaction logic 140 is located on the IC, as shown in FIG. 1.

In FIG. 1, the IC 100 further comprises a shift register 170 to which the outputs of the space compaction network 160 are coupled. In test mode, the shift register 170, which may be controlled by an IEEE 1149.1 (or JTAG) compliant test access port controller (not shown), forwards the test results that are captured from the outputs of the space compaction network 160 to a test data out (TDO) pin 172, which may be a part of an IEEE 1149.1 (or JTAG) compliant test access port (not shown) to facilitate observation of the test results on the outside of the IC 100. This limits the number of IC pins that have to be contacted by an external device such as an automated test equipment (ATE), which reduces the risk of damage to such pins.

It is emphasized that the presence of shift register 170 is not essential to the present invention; alternatively, the test results at the outputs of the space compaction network 160 may also be forwarded to IC pins 180 to facilitate observation of the test results on the outside of the IC 100. Although this requires that more pins may have to be contacted in comparison to a shift register based solution, this has the advantage that the test results become more rapidly available externally to the IC 100, which reduces test time and cost.

It is furthermore emphasized that the phrase 'integrated circuit arrangement' in this description and the claims is intended to include embodiments of an integrated circuit in isolation (i.e. without the presence of an external test apparatus).

Figure 2:
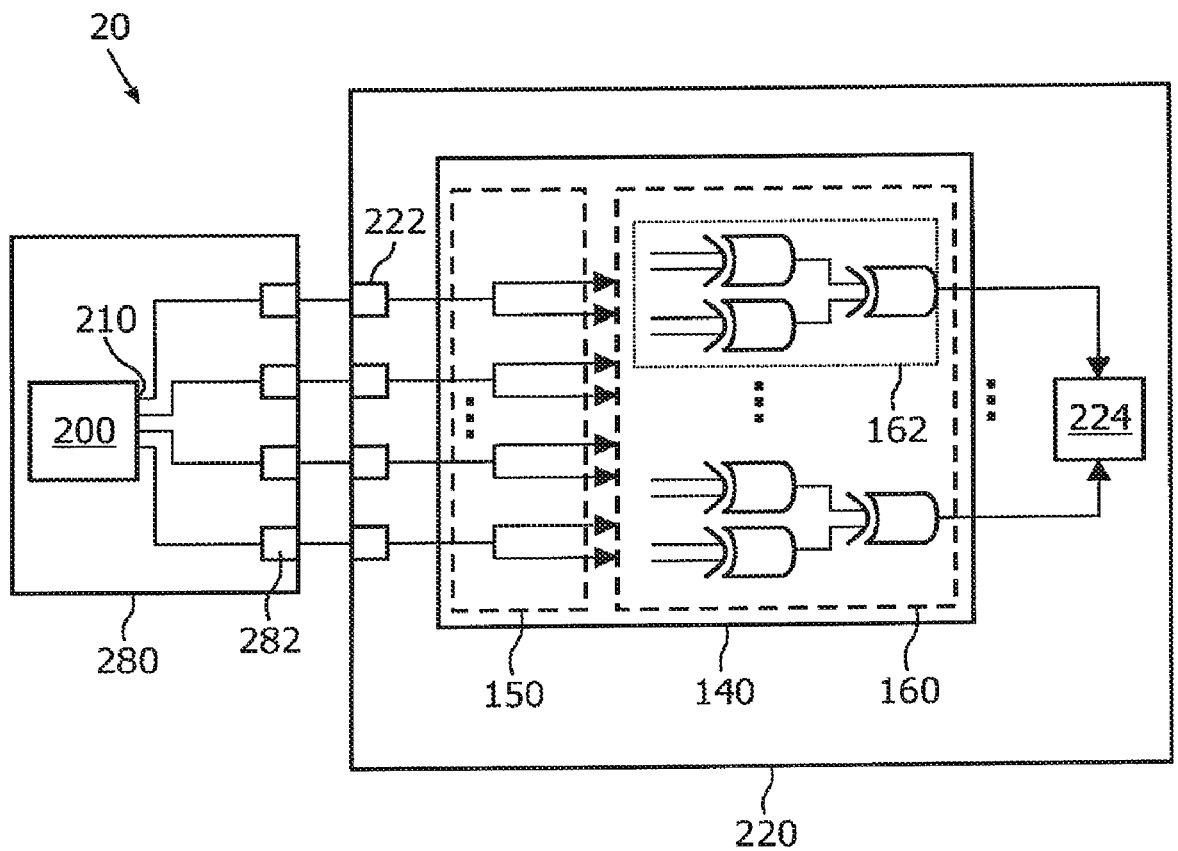
FIG. 2 depicts another IC arrangement of the present invention.

FIG. 2 shows an IC arrangement 20 of the present invention, in which a test apparatus 220 according to the present invention is shown in cooperation with an IC 200. The test apparatus 220 has a plurality of inputs 222 that are conductively coupled to the digital outputs 210 of the IC 200, for instance via interconnects 282 of an interface 280, e.g. a load board. In the IC arrangement 20, the space compaction logic 140 as described in detail in FIG. 1 resides on board of the test apparatus 220. This has the advantage that no additional hardware (i.e. space compaction logic 140) has to be added to the IC 200. The compacted test results may be forwarded to a processor 224 for further processing and/or interpretation.

Alternatively, a conventional test apparatus may be used with the space compaction logic 140 of the present invention being located on the interface 280. This improves the flexibility of the test arrangement, because an interface 280 can be more easily and therefore more cheaply modified or manufactured for a specific application than a test apparatus.

However, it will be appreciated that the preferred embodiment has the SCL 140 residing on board the IC 100. Typically, the duration of the test of an IC such as IC 100 depends on the number of accessible pins during the test. In case of limited pin availability, only a few scan chains can be coupled to the few available pins, and long scan chains have to be used inside the CUT 120 to facilitate sufficient test coverage, which adds to the overall test time. The presence of SCL 140 means that more and shorter scan chains can be included in the IC design, thus improving the duration of the test of such an IC.

The space compaction logic (SCL) 140 may be designed in the following way. IC 100 has n digital outputs 122 on which test responses are observed during IC testing. The n digital outputs 122 are for instance scan chain outputs or data outputs, as previously stated. In FIG. 1, the n digital outputs 122 of the CUT 100 are connected to the SCL 140 for compacting the n test response bits into m bits in each clock cycle.

In the spreading network 150, each of the n SCL input signals is used as fanout stem to feed f fanout branches 152. The spreading network therefore has n inputs and n·f outputs. The n·f outputs of the spreading network 150 are used as inputs to the compaction network 160 to compact the test responses into m output bits. The compaction network comprises m domains 162 of X(N)OR gates, i.e. m X(N)OR-trees, and has n·f inputs and m outputs. Each domain 162 in the compaction network 160 has one output and either $$g_1 = \left\lceil \frac{n \cdot f}{m_1} \right\rceil \text{ or } g_2 = \left\lfloor \frac{n \cdot f}{m_2} \right\rfloor$$

inputs, such that $m_1 \cdot g_1 + m_2 \cdot g_2 = n \cdot f$ and $m_1 + m_2 = m$. The SCL 140 compacts n bits into m bits, and its compaction ratio therefore is $$c = \frac{n}{m}.$$

In FIG. 1, the complete SCL 140 is implemented on the IC 100 as an example. The SCL 140 may also be placed off-chip, for instance on a load-board 280 or inside the automated test apparatus 220, as previously explained and shown in FIG. 2.

All SCL inputs may have the same fanout f, while the number of inputs for each of the XOR-tree based domains 162 in the compaction network 160 is also nearly equal (either $g_1$ or $g_2$). These choices are convenient since they ease generation of the SCL 140 and therefore are a preferred embodiment, but are not strictly required.

The function of an SCL 140 with n inputs and m outputs can be represented in a matrix M of n rows and m columns. Element $m_{ij}$ corresponds to the element of matrix M at row i and column j. The matrix has the following properties:

$m_{ij}=1$ indicates that there is a connection through the spreading network and compaction network from SCL input i to SCL output j; $m_{ij}=0$ indicates that there is no such connection.

Each row corresponds to an SCL input. In the spreading network, each SCL input feeds f fanout branches. Each row therefore contains f ones and m−f zeros.

Each column corresponds to an SCL output. In the compaction network 160, each SCL output is connected to g inputs (where g is either $g_1$ or $g_2$). Each column therefore contains g ones and n−g zeros.

Since $m_{ij} \in \{0,1\}$, each of the f fanout branches of any SCL input is connected to a different XOR tree. This is guaranteed if $f \leq m$. In order to maximize the amount of information that is transferred from the SCL inputs to the SCL outputs, the following constraints are imposed on the SCL and the corresponding matrix:

All columns are distinct. Each SCL output therefore contains information from a different set of SCL inputs.

The overlap between any two columns is minimum. This minimizes the amount of information on each SCL output that is also present on any other SCL output. The overlap between two columns is defined as follows:

For two bits, the overlap is defined as: overlap(0,0)=overlap(1,1)=1, and overlap(0,1)=overlap(1,0)=0. This corresponds to an XNOR function, and hence overlap(a,b)=a XNOR b.

For two bit-vectors, overlap(a,b) is defined as weight(a XNOR b). The weight of a bit-vector indicates the number of bits in the vector that are 1. For instance, overlap(0100,0110)=weight(0100 XNOR 0110)=weight(1101)=3. The bit-vectors 0100 and 0110 have 3 bits in common.

In order to maximize the compression ratio, the number of digital outputs n should be relatively large, while the number of SCL outputs m should be relatively small. Furthermore, the number of fanouts f should be kept low in order to facilitate routing of the SCL when creating the IC circuit layout. In practice, n will be in the range O(10) to O(1000), m in the range O(1) to O(10), and f in the range O(1).

In the SCL matrix M, each column contains n bits of which g bits are one, and each row contains m bits of which f bits are one. The total number of distinct columns and distinct rows therefore corresponds to $$\binom{n}{g} \text{ and } \binom{m}{f}$$

respectively. In practice, $$\binom{n}{g}$$

will be very large since n and g are relatively large, while $$\binom{m}{f}$$

will be rather small since m and f are relatively small. For instance, for n=1000, m=100, f=2, and $$g = \frac{n \cdot f}{m} = \frac{1000 \cdot 2}{100} = 20$$

holds that $$\binom{n}{g} = 3.4 \cdot 10^{41}$$

while $$\binom{m}{f} = 4950.$$

In practice, it is therefore possible to enumerate $$1, \ldots, \binom{m}{f}$$

while enumerating $$1, \ldots, \binom{n}{g}$$

will be unfeasible. This property is applied for efficient generation of the SCL 140 as described below.

Figure 3:
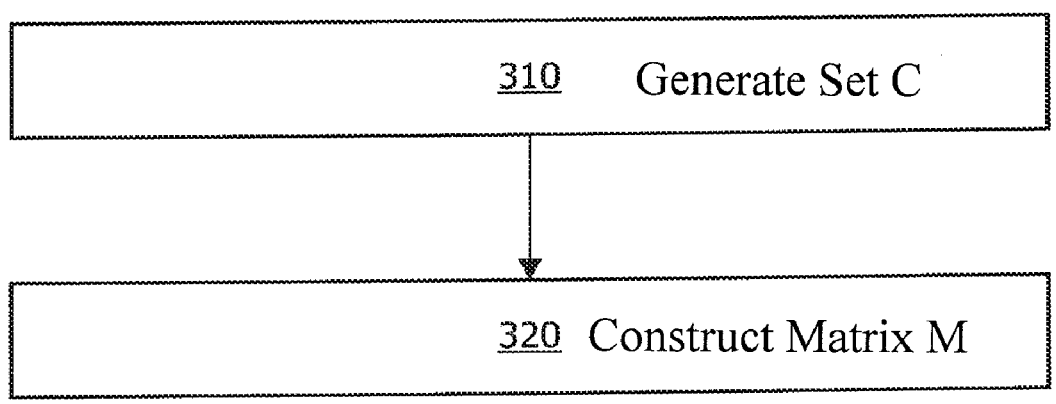
FIG. 3 depicts a flow chart of the design method of the present invention.

An SCL 140 for given parameters n, m, and f is designed as follows, with reference to the flowchart of FIG. 3.

In step 310, generate the set C of all bit-vectors of m bits wide that contain f ones and m−f zeros, and in step 320, construct matrix M from set C. The rows of matrix M are bit-vectors from set C. The vectors are chosen from C in such a way that the overlap between any two columns in matrix M is minimized. Details for the steps 310 and 320 are as follows.

Set C contains all bit-vectors of m bits wide that contain f ones and m−f zeros. There are $$\binom{m}{f}$$

possible vectors, and hence $$|C| = \binom{m}{f}.$$

Set C can be represented in a matrix Q, such that each vector $c_i$ in C corresponds to row i in Q. Matrix Q has m columns and $$\binom{m}{f}$$

rows, and each row contains f ones. It furthermore holds that each column of matrix Q contains $$\binom{m-1}{f-1}$$

ones. (This corresponds to the number of rows that have a one in a certain column-position, and the remaining f−1 ones arbitrarily distributed over the remaining m−1 column-positions.)

Matrix M is built from the rows in matrix Q. Let $n_i$ indicate the number of times that row i from matrix Q occurs in matrix M. Matrix M has n rows, and hence:

$$\Sigma_{i=1,\ldots,|C|} n_i = n \quad (1)$$

Let $q_{ij}$ indicate the element of matrix Q at row i and column j. Each column in matrix M should contain g ones and n−g zeros, and hence:

$$\forall_{j=1\ldots m} : \Sigma_{i=1\ldots|C|} n_i \cdot q_{ij} = g \quad (2)$$

Equation (1) and (2) yield a system of m+1 linear equations in $$\binom{m}{f}$$

unknowns ($n_i$). This system is solvable (with multiple solutions) if $$m+1 < \binom{m}{f}.$$

The overlap between any two columns in matrix M should be minimized, and hence the number of times that a row from matrix Q occurs in matrix M should be minimized. A constraint is therefore to minimize $\max_{i=1\ldots|C|} n_i$. Since there are $$h = \binom{m-1}{f-1}$$

rows in matrix Q that have a one at the same column-position, it follows that $$\max_{i=1\ldots|C|} n_i = \lceil \tfrac{g}{h} \rceil.$$

This constraint allows selecting an appropriate solution.

For f=1, the SCL 140 has no spreading network 150 and consists of the compaction network 160 only. In that case, each SCL input is connected to one SCL output, and hence each SCL output is connected to a distinct set of SCL inputs.

For f>1, the overlap is minimized if $$\max_{i=1\ldots|C|} n_i = \lceil \tfrac{g}{h} \rceil = 1,$$

which leads to g≦h and hence $$n \le \binom{m}{f}.$$

Note that this requirement combined with requirement m<n, leads to $$m < \binom{m}{f},$$

which is also required for obtaining a solvable system of linear equations. Matrix Q contains $$\binom{m}{f}$$

rows and m columns. Each row contains f ones, and each column contains $$\binom{m-1}{f-1}$$

ones. The maximum overlap between any two columns in matrix Q is:

$$\max_{i,j=1,\ldots,m, i \ne j} \sum_{k=1,\ldots,\binom{m}{f}} q_{ki} \cdot q_{kj} = \binom{m-2}{f-2}$$

The latter result is derived from counting the number of rows that have ones in two specific column-positions, and hence that have the remaining f−2 ones arbitrarily distributed over the remaining m−2 column-positions. The maximum overlap between any two columns in matrix M is:

$$\max_{i,j=1,\ldots,m, i \ne j} \sum_{k=1,\ldots,\binom{m}{f}} n_k \cdot q_{ki} \cdot q_{kj} \le \lceil \tfrac{g}{h} \rceil \cdot \binom{m-2}{f-2}$$

In case of minimum overlap, it holds for the compaction ratio that $$c = \frac{n}{m} \le \binom{m}{f} \cdot \frac{1}{m}.$$

Hence, higher compaction ratio can be achieved for larger f, and the maximum is achieved for $$f = \frac{m}{2}.$$

In practice however, f has to be chosen small for avoiding congestion during place-and-route of an IC 100 on which SCL 140 is to be placed, as previously explained.

An example of a design of an SCL 140 with n=10, m=4, and f=2 using the design method of the present invention is given below. From the teachings of the method of the present invention, it follows that $$g = \frac{n \cdot f}{m} = \frac{10 \cdot 2}{4} = 5, \text{ and } h = \binom{m-1}{f-1} = \binom{3}{1} = 3.$$

Now:
  a) The set C of all bit-vector of 4 bits wide that contain 2 ones, has cardinality $$|C| = \binom{m}{f} = \binom{4}{2} = 6.$$

C={(1100), (1010), (1001), (0110), (0101), (0011)}.
  b) The system of m+1=5 equations in 6 unknowns is as follows:

$$n_1+n_2+n_3+n_4+n_5+n_6=n=10.$$

$$n_1 \cdot 1+n_2 \cdot 1+n_3 \cdot 1+n_4 \cdot 0+n_5 \cdot 0+n_6 \cdot 0=n_1+n_2+n_3=g=5$$

$$n_1 \cdot 1+n_2 \cdot 0+n_3 \cdot 0+n_4 \cdot 1+n_5 \cdot 1+n_6 \cdot 0=n_1+n_4+n_5=g=5$$

$$n_1 \cdot 0+n_2 \cdot 1+n_3 \cdot 0+n_4 \cdot 1+n_5 \cdot 0+n_6 \cdot 1=n_2+n_4+n_6=g=5$$

$$n_1 \cdot 0+n_2 \cdot 0+n_3 \cdot 1+n_4 \cdot 0+n_5 \cdot 1+n_6 \cdot 1=n_3+n_5+n_6=g=5$$

Solving the system results in the following solution:
$n_1=n_6$, $n_2=n_5$, $n_3=n_4$, and $n_1+n_2+n_3=5$
  c) Since $$\max_{i=1 \ldots |C|} n_i = \lceil \frac{g}{h} \rceil = \lceil \frac{5}{3} \rceil = 2,$$

each row in matrix M occurs at most 2 times.
  Appropriate solutions therefore are:
    Solution 1: $n_1=1, n_2=2, n_3=2, n_4=2, n_5=2, n_6=1$.
    Solution 2: $n_1=2, n_2=1, n_3=2, n_4=2, n_5=1, n_6=2$.
    Solution 3: $n_1=2, n_2=2, n_3=1, n_4=1, n_5=2, n_6=2$.
Matrix M according to solution 1 is:

$$\begin{pmatrix} 1 & 1 & 0 & 0 \\ 1 & 0 & 1 & 0 \\ 1 & 0 & 1 & 0 \\ 1 & 0 & 0 & 1 \\ 1 & 0 & 0 & 1 \\ 0 & 1 & 1 & 0 \\ 0 & 1 & 1 & 0 \\ 0 & 1 & 0 & 1 \\ 0 & 1 & 0 & 1 \\ 0 & 0 & 1 & 1 \end{pmatrix}$$

It is pointed out that the rows in this matrix can be reordered arbitrarily.
  d) The maximum overlap between the columns in matrix M is $$\lceil \frac{g}{h} \rceil \cdot \binom{m-2}{f-2} = \lceil \frac{5}{3} \rceil \binom{2}{0} = 2.$$

In order to reduce the overlap, all rows should be distinct and it should hold that $$n \le \binom{m}{f}.$$

The maximum compression is achieved for $$f = \frac{m}{2}.$$

For m=4 and f=2 holds that n≤6, which is conflicting with requirement n=10.
Hence, no SCL 140 can be constructed for n=10 and m=4 such that there is minimum overlap between the SCL outputs. This, however, can be achieved by increasing m, for instance by choosing m=5 and f=2.

The fault detection capabilities of an SCL 140 according to the present invention are as follows:
  A single fault is always detected if all rows in matrix M are not 0. For fanout f, the fault is observed at f SCL outputs.
  Two simultaneous faults are detected if all rows are distinct. The XOR (i.e. modulo-2 sum) of any two rows is then a vector that is not equal to 0.
  Any odd number of simultaneous faults is detected if the XOR (i.e. modulo-2 addition) of any odd number of rows results in a vector that is not equal to 0. This is achieved for instance in case the fanout f is odd. In that case, all rows contain an odd number of ones. The total number of ones in any odd number of rows, where each row contains an odd number of ones, is the product of two odd numbers, which always results in an odd number.
  Four or a higher even number of simultaneous faults may not be detected. However, the design of the SCL 140 ensures that the probability for non-detection is minimized.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An integrated circuit arrangement comprising:
   a plurality of digital outputs, each of the outputs being arranged to provide a test result when the integrated circuit is in a test mode; and
   space compaction logic including:
      a space compaction network having a plurality of compaction domains, each domain being arranged to compact a plurality of test results into a further test result; and
      a spreading network coupled between the plurality of digital outputs and the space compaction network, the spreading network being arranged to duplicate each test result from the digital outputs to a number of compaction domains.

2. The integrated circuit arrangement as claimed in claim 1, wherein each compaction domain comprises a network of exclusive logic gates.

3. The integrated circuit arrangement as claimed in claim 1, wherein each compaction domain is coupled to a unique set of digital outputs.

4. The integrated circuit arrangement as claimed in claim 1, wherein each compaction domain has an output for producing its further test result, the integrated circuit further comprising a shift register for serially shifting data towards a test data output of the integrated circuit, the respective outputs of the compaction domains being coupled to respective cells of the shift register.

5. The integrated circuit arrangement as claimed in claim 1, further comprising a test means including an automated test apparatus and a load board for coupling the integrated circuit to the test apparatus, the test means further comprising the space compaction logic.

6. The integrated circuit arrangement as claimed in claim 1, wherein the spreading network is configurably coupled to the digital outputs.

7. A method for designing space compaction logic for testing an integrated circuit having a plurality of digital outputs, the method comprising:
   providing the space compaction logic with
      a space compaction network having a plurality of compaction domains having m outputs, each domain being arranged to compact a plurality of test results into a further test result; and
      a spreading network having n inputs for coupling between the plurality of digital outputs and the space compaction network, the spreading network being arranged to duplicate each test result from the digital outputs to f compaction domains, f, n and m being positive integers with n being larger than m, and m being larger than f;
   generating a set of bit vectors, each vector comprising m bits, each bit indicating the presence of a conductive path from an input of the spreading network to an output of the space compaction network, the total number of conductive paths per vector being; and
   combining n vectors from the set of bit vectors into a matrix of size n*m, such that in a direction of the matrix perpendicular to a direction of the vectors the number of said conductive paths is limited, said matrix representing the space compaction logic design.

8. The method as claimed in claim 7, wherein the step of combining n vectors from the set of bit vectors into a matrix of size n*m, such that in a direction of the matrix perpendicular to the direction of the vectors the number of conductive paths is limited comprises minimizing said number.

9. A test apparatus comprising:
   a plurality of inputs for connecting to a plurality of digital outputs of an integrated circuit, each of the digital outputs being arranged to provide a test result when the integrated circuit is in a test mode; and
   space compaction logic with
      a space compaction network having a plurality of compaction domains, each domain being arranged to compact a plurality of test results into a further test result; and
      a spreading network coupled between the plurality of inputs and the space compaction network, the spreading network being arranged to duplicate each test result from the digital outputs to a number of compaction domains.

10. The test apparatus as claimed in claim 9, wherein each compaction domain comprises a network of exclusive logic gates.

11. The test apparatus as claimed in claim 9, wherein each compaction domain is arranged to be coupled to a unique set of inputs.

12. An interface for coupling an integrated circuit having a plurality of digital outputs to a plurality of inputs of a test apparatus for testing the integrated circuit, the interface comprising:
   space compaction logic including:
      a space compaction network having a plurality of compaction domains, each domain being arranged to compact a plurality of test results into a further test result, each domain including an output for providing the further test result to an input of the test apparatus; and
      a spreading network coupled between the plurality of digital outputs and the space compaction network, the spreading network being arranged to duplicate each test result from the digital outputs to a number of compaction domains.

13. The interface as claimed in claim 12, wherein each compaction domain comprises a network of exclusive logic gates.

14. The interface as claimed in claim 12, wherein each compaction domain is arranged to be coupled to a unique set of digital outputs.

* * * * *